(12) United States Patent
Cho et al.

(10) Patent No.: US 8,384,859 B2
(45) Date of Patent: Feb. 26, 2013

(54) LIQUID CRYSTAL DISPLAY DEVICE AND METHOD FOR FABRICATING THE SAME

(75) Inventors: Suk-Ho Cho, Paju (KR); Jae-Hyun You, Seoul (KR); Ji-Suk Min, Seoul (KR); Yoon-Oh Kim, Eupho-Ri (KR)

(73) Assignee: LG Display Co., Ltd., Seoul (KR)

( * ) Notice: Subject to any disclaimer, the term of this patent is extended or adjusted under 35 U.S.C. 154(b) by 253 days.

(21) Appl. No.: 12/982,159

(22) Filed: Dec. 30, 2010

(65) Prior Publication Data

US 2012/0092596 A1    Apr. 19, 2012

(30) Foreign Application Priority Data

Oct. 14, 2010    (KR) .................. 10-2010-0100526

(51) Int. Cl.
*G02F 1/1335* (2006.01)
*G02F 1/1339* (2006.01)
*H01J 9/00* (2006.01)

(52) U.S. Cl. ........................................ 349/106; 349/155

(58) Field of Classification Search .................. 349/106, 349/107, 154, 155, 33, 42, 43, 141, 143, 349/157, 187; 445/24, 25
See application file for complete search history.

(56) References Cited

U.S. PATENT DOCUMENTS

| 8,045,129 B2 * | 10/2011 | Kang et al. ..................... 349/175 |
| 8,081,286 B2 * | 12/2011 | Kim et al. ..................... 349/157 |
| 2006/0109222 A1 * | 5/2006 | Lee et al. ..................... 345/88 |
| 2007/0052900 A1 * | 3/2007 | Cho et al. ..................... 349/141 |
| 2007/0165180 A1 * | 7/2007 | Cho ..................... 349/187 |
| 2009/0290081 A1 * | 11/2009 | Cho et al. ..................... 349/42 |
| 2011/0063534 A1 * | 3/2011 | Cho et al. ..................... 349/33 |
| 2011/0063537 A1 * | 3/2011 | Kim et al. ..................... 349/42 |

* cited by examiner

*Primary Examiner* — Akm Enayet Ullah
(74) *Attorney, Agent, or Firm* — Brinks Hofer Gilson & Lione

(57) ABSTRACT

Disclosed are a liquid crystal display (LCD) device, and a method for fabricating the same. The LCD device comprises a lower substrate, gate lines and data lines crossing each other on the lower substrate and defining pixel regions, thin film transistors (TFTs) formed at intersections between the gate lines and the data lines, protrusions disposed on the gate lines in a crossing manner, an upper substrate disposed to face the lower substrate, a first column spacer formed on the upper substrate and corresponding to the protrusion disposed on the lower substrate, a second column spacer disposed on the upper substrate with a distance from the lower substrate, and corresponding to a non-pixel region of the lower substrate, and a liquid crystal layer filled in a space between the lower substrate and the upper substrate.

13 Claims, 8 Drawing Sheets

LIQUID CRYSTAL DISPLAY DEVICE AND METHOD FOR FABRICATING THE SAME

Pursuant to 35 U.S.C. §119(a), this application claims the benefit of earlier filing date and right of priority to Korean Application 10-2010-0100526, filed on Oct. 14, 2010, the content of which is incorporated by reference herein in its entirety.

BACKGROUND

1. Field of the Invention

The present disclosure relates to a liquid crystal display (LCD) device, and particularly, to an LCD device having a column spacer for maintaining a cell gap and a push preventing column spacer, and a method for fabricating the same.

2. Discussion of the Related Art

Demands for various display devices have increased with development of an information society. Accordingly, many efforts have been made to research and develop various flat display devices such as Liquid Crystal Display (LCD) devices, Plasma Display Panels (PDPs), Organic Electro Luminescent Displays (OLEDs) and Vacuum Fluorescent Displays (VFDs). Some of the flat display devices have already been applied to displays for various equipments.

Among the various flat display devices, LCD devices have been most widely used due to their advantageous characteristics such as thin profile, lightweight and low power consumption, and thus are substituting for Cathode Ray Tubes (CRTs). In addition to mobile type LCD devices such as LCD devices for notebook computers, LCD devices have been developed for computer monitors and televisions to receive display broadcasting signals.

In order to use LCD devices in various fields as a general display, LCD devices should offer a high picture quality, such as a high resolution and high luminance with a large-sized screen, while still maintaining such characteristics as lightweight, thin profile and low power consumption.

The LCD device may be categorized into an LC injecting type and an LC dispensing type according to a fabrication method thereof.

In case of the LC dispensing type of LCD device, an LC is dropped on one substrate and the substrate is bonded to another substrate. When using a ball spacer, the ball spacer is rolled on the substrate together with the LC. This may cause a difficulty in maintaining a proper cell gap.

Accordingly, a column spacer fixed to a predetermined part on a substrate has been proposed. In the LC dispensing type of LCD device, a column spacer is formed on a color filter substrate, and an LC is dropped onto a TFT substrate. Then, the two substrates are bonded to each other to form a panel.

However, the LC dispensing type of LCD device may have the following problems. Although not shown, the column spacer contacts upper and lower substrates with large contact areas, and a large frictional force is applied between the column spacer and the lower substrate. Accordingly, once the column spacer has moved to a touching direction, the upper substrate may not be restored to the original state. In this case, a space between the lower and upper substrates having no column spacer has a cell gap larger than that of a part where the column spacer is installed. On a region touched by a user's finger or a pen, a liquid crystal is scattered. And, a liquid crystal is not normally driven on the touched region and the peripheral region due to a deficient or excessive state of the LC. This may cause a touch defect, i.e., stains may occur at an interface between the touched region and the peripheral region.

The reason why the touch defect occurs on the LCD device having a column spacer is because the column spacer is fixed to one substrate, and comes in contact with an upper surface of another substrate. That is, the touch defect results from a wide contact area between the column spacer and the substrate.

In order to solve the touch defect, has been proposed an LCD device having a gap maintaining column spacer and a push preventing column spacer.

The conventional LCD device having a gap maintaining column spacer and a push preventing column spacer will be explained in more detail with reference to FIGS. 1 to 3.

FIG. 1 is a planar view of a liquid crystal display (LCD) device including a double column spacer in accordance with the conventional art, FIG. 2 is an enlargement sectional view taken along line 'II-II' in FIG. 1, which shows a column spacer contacting a circular protrusion arranged on a gate line, and FIG. 3 is an enlargement sectional view taken along line 'III-III' in FIG. 1, which shows a column spacer and a push preventing column spacer contacting circular protrusions arranged on gate lines.

As shown in FIGS. 1 to 3, the conventional LCD device comprises a lower substrate 11 and an upper substrate 31 facing each other, and an LC layer 41 filled in a space between the lower substrate 11 and the upper substrate 31.

On the lower substrate 11, gate lines 13 and data lines 19 for defining pixel regions are formed to cross each other. Thin film transistors (T) are formed at intersections between the gate lines 13 and the data lines 19. And, a pixel electrode 27 is formed at each pixel region.

The thin film transistor (T) includes a gate electrode 13a extending from the gate line 13, a semiconductor layer 17a formed to cover the gate electrode 13a, a source electrode 19a extending from the data line 19 and formed at one side of the semiconductor layer 17a, and a drain electrode 19b spacing from the source electrode 19a by a predetermined interval and formed at another side of the semiconductor layer 17a.

As shown in FIGS. 2 and 3, a circular protrusion 21 is formed on the gate line 13. The circular protrusion 21 consists of a metal layer pattern 19c of the data line 19, and a semiconductor layer 17a disposed below the metal layer pattern 19c. The metal layer pattern 19c has an additional contact surface by a tail of the semiconductor layer 17a. This may cause changes of PPM (a ratio of a contact area with respect to a total area).

The gate line 13 is formed on the lower substrate 11 so as to insulate metallic lines from each other. A gate insulating layer 15 is formed on the entire surface of the substrate including the gate line 13. And, a protection film 23 is formed on the gate insulating layer 15. Here, the protrusion 21 insulates the gate line 13 and the data line 19 from each other by having the gate insulating layer 15 therebelow.

On the upper substrate 31 facing the lower substrate 11, formed are a black matrix layer 33 for shielding non-pixel regions (e.g., the gate lines, the data lines and TFTs) rather than the pixel regions, a color filter layer 35 having R, G and B colors at the respective pixel regions, and a common electrode 37 formed on the entire surface of the upper substrate 31 including the color filter layer 35.

Above the common electrode 37, formed are a first column spacer 39a for maintaining a cell gap, and a second column spacer 39b spacing from the lower substrate 11 by a predetermined interval.

The first and second column spacers 39a and 39b have the same height, and are formed on the upper substrate 31. The first column spacer 39a is arranged at a position corresponding to the circular protrusion 21, and the second column spacer 39b is arranged above the gate line 13 or the data line 19 at a position not corresponding to the circular protrusion 21.

When bonding the lower substrate 11 and the upper substrate 31 to each other, the first column spacer 39a comes in contact with the circular protrusion 21 by a pressure generated during the bonding process. And, the second column spacer 39b is spacing from the protection film 23, the uppermost layer of the lower substrate 11.

As mentioned above, the conventional LCD device has the following problems.

In the conventional LCD device, the column spacer is implemented by disposing the circular protrusion on the gate line. Here, wet and dry etching processes are performed in every direction of the circular protrusion. This may degrade CD uniformity inside a glass substrate (mother substrate). More concretely, some panels inside a glass substrate may not have gap defect owing to an optimized contact area ratio, whereas other panels may have gap defect due to a reduced contact area ratio.

Furthermore, the conventional circular protrusion undergoes exposing and etching processed in every direction. This may cause large CD (critical dimension) changes of the circular protrusion according to a glass substrate (mother substrate) and processing dimensions. Since the circular protrusion has an additional contact area with the column spacer due to a tail of the semiconductor layer in every direction, PPM is greatly changed.

BRIEF SUMMARY

Therefore, an object of the present invention is to provide a liquid crystal display (LCD) device capable of minimizing the occurrence of gap stains by minimizing a contact area ratio changed during processes, and a method for fabricating the same.

A liquid crystal display (LCD) device, comprises a lower substrate; gate lines and data lines crossing each other on the lower substrate, and defining pixel regions; thin film transistors (TFTs) formed at intersections between the gate lines and the data lines; protrusions disposed on the gate lines in a crossing manner; an upper substrate disposed to face the lower substrate; a first column spacer formed on the upper substrate, and corresponding to the protrusion disposed on the lower substrate; a second column spacer disposed on the upper substrate with a distance from the lower substrate, and corresponding to a non-pixel region of the lower substrate; and a liquid crystal layer filled in a space between the lower substrate and the upper substrate.

A method for fabricating a liquid crystal display (LCD) device is also disclosed. The method comprises providing a lower substrate and an upper substrate facing each other; forming, on the lower substrate, a gate line and a gate electrode extending from the gate line; forming a gate insulating layer on an entire surface of the substrate including the gate electrode and the gate line; forming, on the gate insulating layer, a semiconductor layer covering the gate electrode; forming, on the gate insulating layer including the semiconductor layer, a data line, a source electrode extending from the data line, a drain electrode spacing from the source electrode, and a protrusion crossing the gate line; forming a passivation layer on an entire surface of the substrate including the data line, the source electrode and the drain electrode; forming, in the passivation layer, a contact hole through which the drain electrode is exposed to outside; forming, on the passivation layer, a pixel electrode electrically connected to the drain electrode through the contact hole; forming a first column spacer at a position of the upper substrate corresponding to the protrusion; forming a second column spacer, with a predetermined height, at a position of the upper substrate corresponding to the lower substrate and a non-pixel region; dispensing a liquid crystal on the lower substrate; and bonding the lower substrate and the upper substrate to each other.

The present invention may have the following advantages.

Firstly, since the protrusion is formed to cross the gate line, two sides of the protrusion may not have PPM changes due to process changes. The reason may be because the protrusion is defined by the gate lines having excellent uniformity in a glass substrate (mother substrate).

Secondly, in case of the conventional circular protrusion, a single structure may be implemented as an active tail is disposed below a source/drain electrode forming metal layer. This may cause changes of PPM (a ratio of a contact area with respect to a total area). However, in the present invention, the protrusion may be formed to cross the gate lines to reduce the conventional problem by 50% or more. More concretely, as the data line metal layer pattern of the protrusion is disposed on the gate line in a crossing manner, the first region (A) may have the same PPM as the conventional one. However, the second region (B) may have PPM lower than the conventional one by 50% or more since it can be precisely defined by the gate lines.

Thirdly, since the protrusion is formed to cross the gate lines, changes of PPM due to process changes may be minimized. This may reduce the occurrence of a gap defect.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE DRAWINGS AND THE PRESENTLY PREFERRED EMBODIMENTS

Description will now be given in detail of the exemplary embodiments of present invention, with reference to the accompanying drawings.

For the sake of brief description with reference to the drawings, the same or equivalent components will be provided with the same reference numbers, and description thereof will not be repeated.

A liquid crystal display (LCD) device according to the present invention will be explained in more detail with reference to the bonded drawings.

Figure 1:
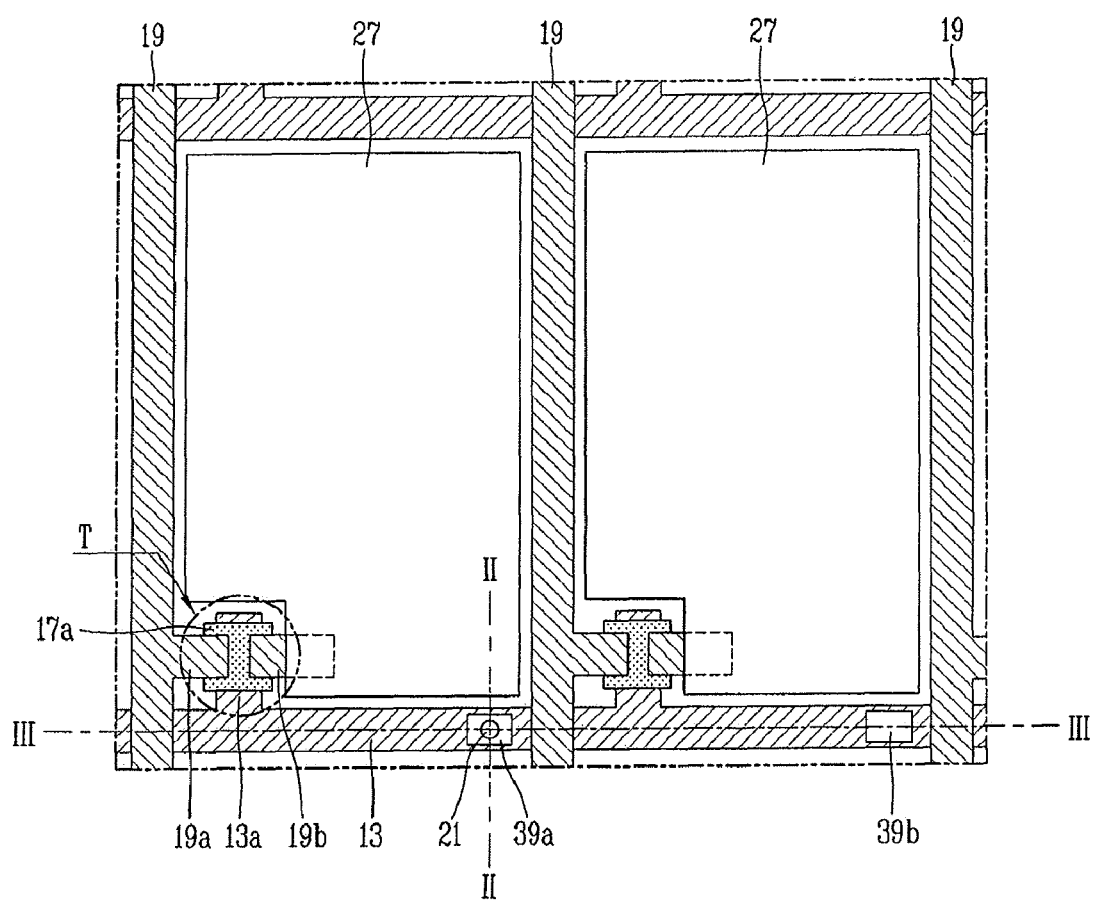
FIG. 1 is a planar view of a liquid crystal display (LCD) device including a double column spacer in accordance with the conventional art.
Figure 2:
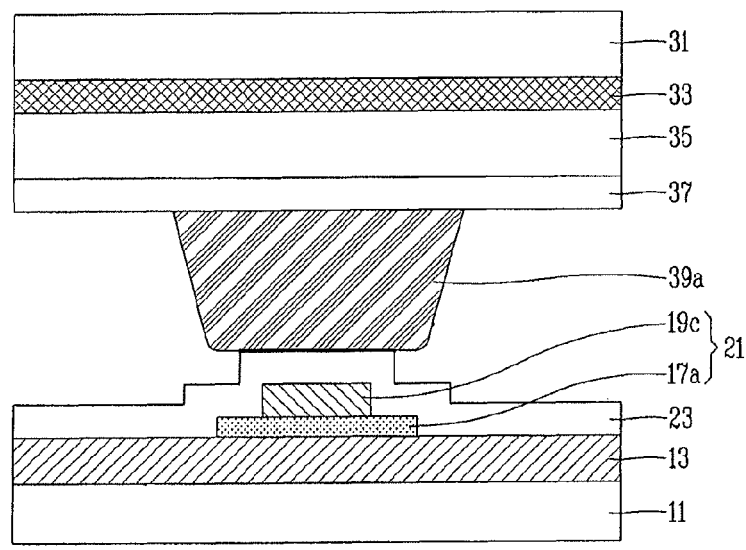
FIG. 2 is an enlargement sectional view taken along line 'II-II' in FIG. 1, which shows a column spacer contacting a circular protrusion arranged on a gate line.
Figure 3:
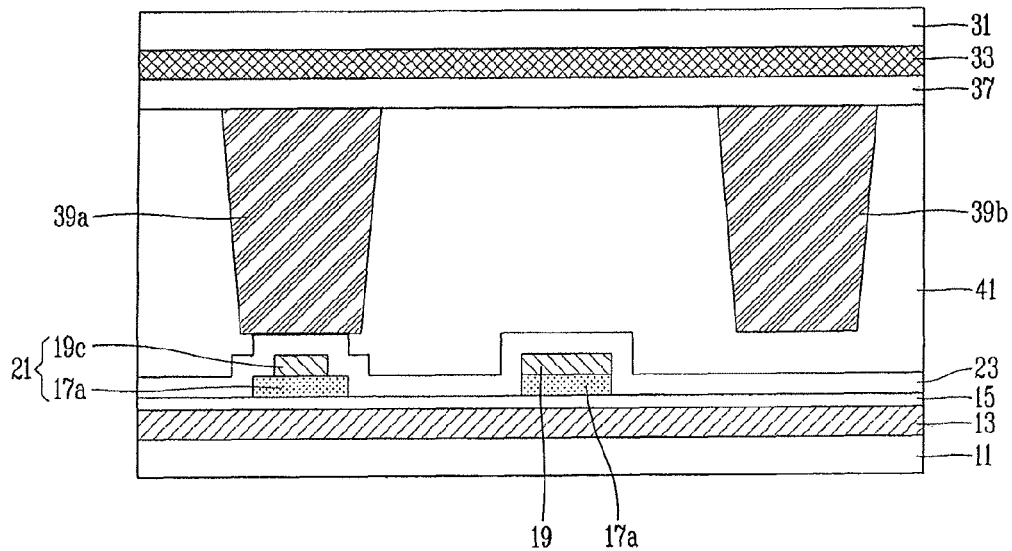
FIG. 3 is an enlargement sectional view taken along line 'III-III' in FIG. 1, which shows a column spacer and a push preventing column spacer contacting circular protrusions arranged on gate lines.
Figure 4:
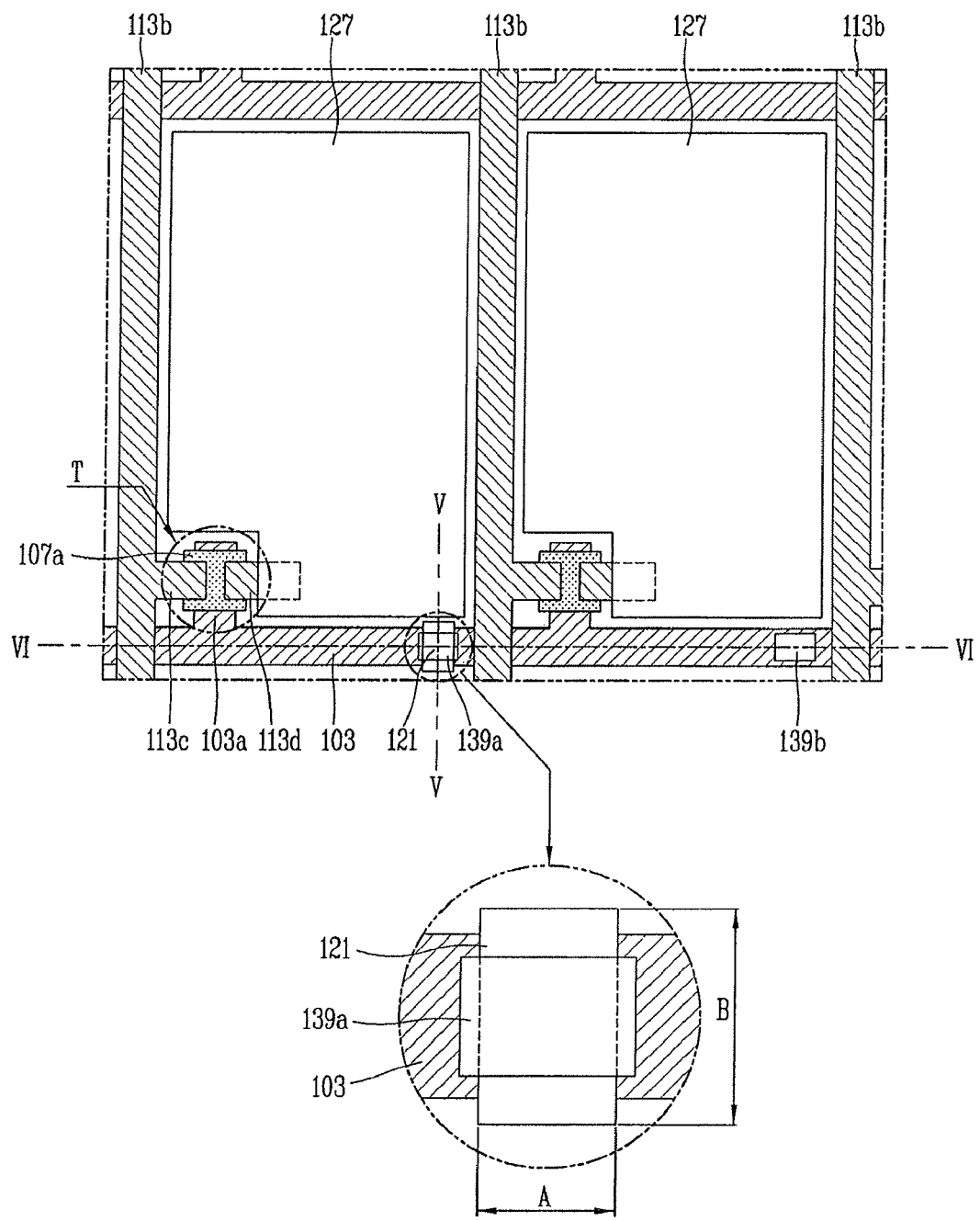
FIG. 4 is a planar view of an LCD device including a double column spacer according to the present invention.
Figure 5:
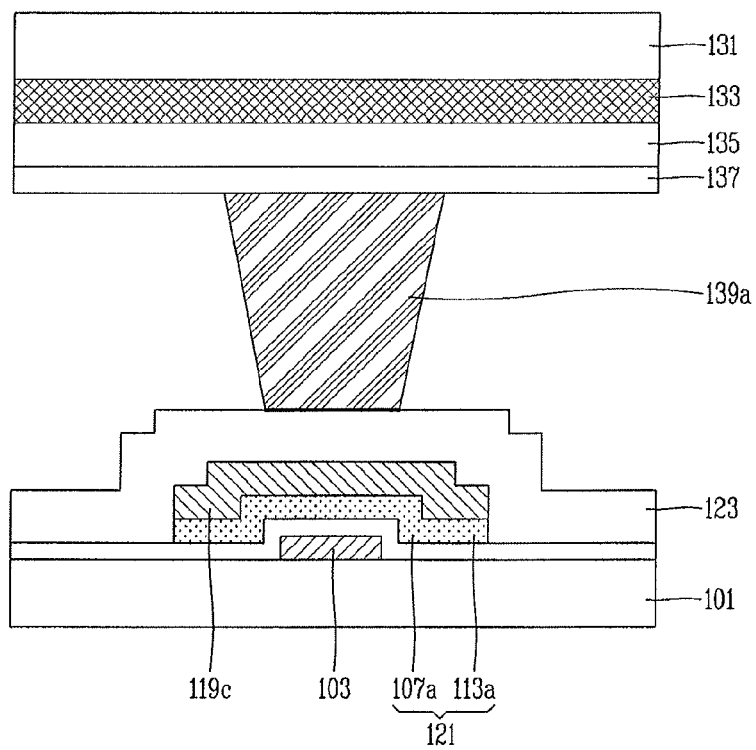
FIG. 5 is an enlarged sectional view taken along line 'V-V' in FIG. 4, which shows a column spacer contacting a protrusion crossing a gate line.
Figure 6:
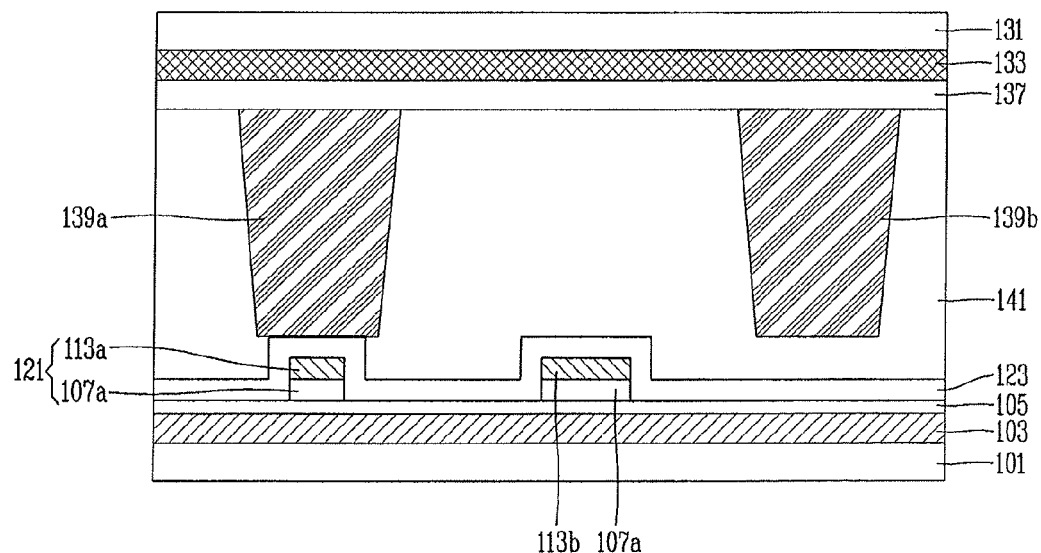
FIG. 6 is an enlarged sectional view taken along line 'VI-VI' in FIG. 4, which shows a column spacer and a push preventing column spacer contacting protrusions crossing gate lines.

FIG. 4 is a planar view of an LCD device including a double column spacer according to the present invention, FIG. 5 is an enlarged sectional view taken along line 'V-V' in FIG. 4, which shows a column spacer contacting a protrusion crossing a gate line, and FIG. 6 is an enlarged sectional view taken along line 'VI-VI' in FIG. 4, which shows a column spacer and a push preventing column spacer contacting protrusions crossing gate lines.

As shown in FIGS. 4 to 6, an LCD device including a protrusion according to the present invention comprises a lower substrate 101, an upper substrate 131, and an LC layer 141 filled between the lower substrate 101 and the upper substrate 131.

On the lower substrate 101, gate lines 103 and data lines 119 for defining pixel regions are formed to cross each other. Thin film transistors (T) are formed at intersections between the gate lines 103 and the data lines 119, and pixel electrodes 129a are formed at pixel regions. Here, common electrodes (not shown) may be formed in an alternating manner with the pixel electrodes 129a.

The thin film transistor (T) includes a gate electrode 103a extending from the gate line 103, a semiconductor layer 107a formed to cover the gate electrode 103a, a source electrode 119a extending from the data line 119 and formed at one side of the semiconductor layer 107a, and a drain electrode 119b spacing from the source electrode 119a by a predetermined interval and formed at another side of the semiconductor layer 107a.

As shown in FIGS. 4 and 5, a protrusion 121 is formed on the gate line 103 in the same layer and with the same metal as the data line 119. The protrusion 121 is formed above the gate line 103 in a crossing manner. Here, a long side of the protrusion 121 is formed to be wider than a width of the gate line 103. The protrusion 121 may be implemented as a single layer of the data line 119, i.e., a data line metal layer pattern 119c. Alternatively, the protrusion 121 may be implemented as a double layer of a data line metal layer pattern 119c and a semiconductor layer 107a disposed below the data line metal layer pattern 119c.

The gate line 103 is formed on the lower substrate 101 so as to insulate metallic lines from each other. A gate insulating layer 105 is formed on the entire surface of the substrate including the gate line 103. And, a protection film 123 is formed on the gate insulating layer 105. Here, the protrusion 121 insulates the gate line 103 and the data line 119 from each other by having the gate insulating layer 105 therebelow.

On the upper substrate 131 facing the lower substrate 101, formed are a black matrix layer 133 for shielding a non-pixel region (e.g., the gate lines, the data lines and TFTs) rather than the pixel region, a color filter layer 135 having R, G and B colors at the respective pixel regions, and a common electrode 137 formed on the entire surface of the upper substrate 131 including the color filter layer 135.

Above the common electrode 137, formed are a first column spacer 139a for maintaining a cell gap, and a second column spacer 139b spacing from the lower substrate 101 by a predetermined interval.

The first and second column spacers 139a and 139b have the same height, and are formed on the upper substrate 131. The first column spacer 139a is arranged at a position corresponding to the protrusion 121, and the second column spacer 139b is arranged above the gate line 103 or the data line 119 at a position not corresponding to the protrusion 121.

When bonding the lower substrate 101 and the upper substrate 131 to each other, the first column spacer 139a comes in contact with the protrusion 121 by a pressure generated during the bonding process. And, the second column spacer 139b is spacing from the protection film 123, the uppermost layer of the lower substrate 101.

The spacing distance between the second column spacer 139b and the lower substrate 101 corresponds to a value obtained by subtracting, from the height of the protrusion 121, a pushed degree of the first column spacer 139a by the protrusion 121.

Accordingly, when arranging the data line metal layer pattern 119c of the protrusion 121 at the gate line 103 in a crossing manner, a first region (A) has the same PPM as the conventional PPM. However, since a second region (B) can be precisely defined by the gate line 103, a contact area ratio between the protrusion and the column spacer with respect to a total area is deceased to PPM less than the conventional PPM by 50% or more than.

The method for fabricating an LCD device according to the present invention will be explained with reference to FIGS. 7A to 7K.

FIGS. 7A to 7K are sectional views showing processes of fabricating an LCD device according to the present invention.

Although not shown, a first conductive metal layer (not shown) is deposited on a transparent insulation substrate 101 by a sputtering method. Here, the first conductive metal layer (not shown) is formed of at least one selected from a conductive metallic group including aluminum (Al), tungsten (W), copper (Cu), molybdenum (Mo), chrome (Cr), titanium (Ti), molybdenum tungsten (MoW), molybdenum titanium (MoTi), copper/molybdenum titanium (Cu/MoTi).

Then, a first photosensitive film (not shown) is deposited on the first conductive metal layer (not shown), and then is exposed to light and developed by a photolithography process using a mask, thereby forming a first photosensitive film pattern (not shown).

Figure 7A:
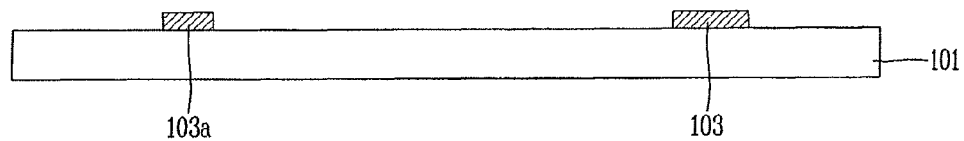
FIGS. 7A to 7K are sectional views showing processes of fabricating an LCD device according to the present invention.

As shown in FIG. 7A, the first conductive metal layer (not shown) is selectively patterned by using the first photosensitive film pattern as a mask, thereby forming a gate line 103 and a gate electrode 103a perpendicularly extending from the gate line 103.

Figure 7B:
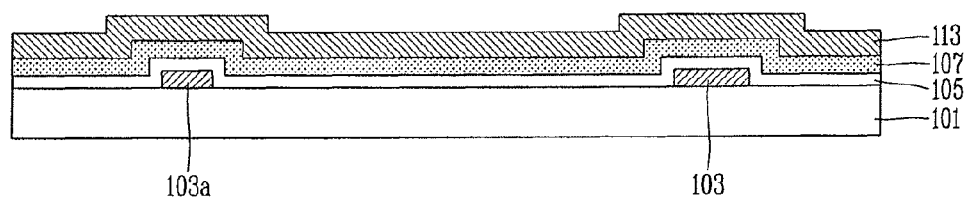

As shown in FIG. 7B, the first photosensitive film pattern (not shown) is removed, and then a gate insulating layer 105, an amorphous silicon layer 107 and a second conductive metal layer 113 are sequentially deposited on the entire surface of the substrate including the gate line 103 and the gate electrode 103a. Here, the second conductive metal layer 113 is formed of at least one selected from a conductive metallic group including aluminum (Al), tungsten (W), copper (Cu), molybdenum (Mo), chrome (Cr), titanium (Ti), molybdenum tungsten (MoW), molybdenum titanium (MoTi), copper/molybdenum titanium (Cu/MoTi).

Figure 7C:
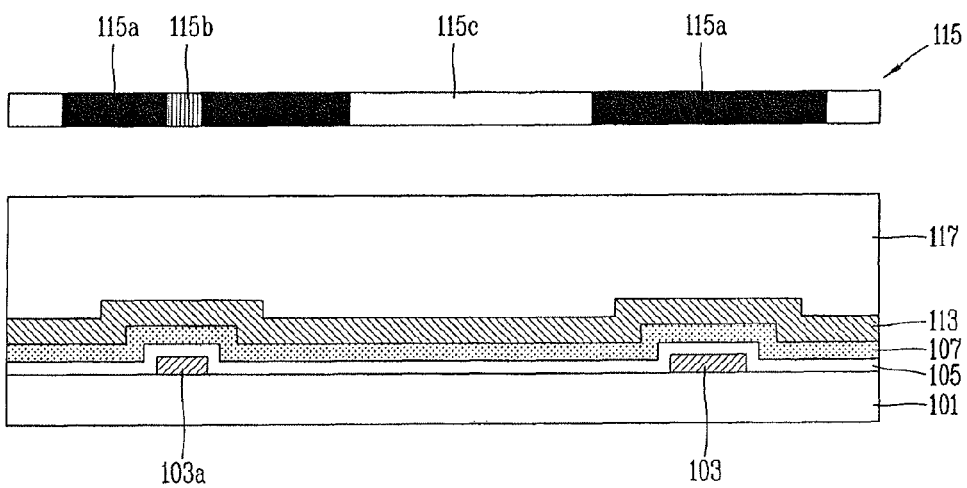

As shown in FIG. 7C, a photo-resist having high transmittance is deposited on the second conductive metal layer 113, thereby forming a second photosensitive film 117.

Then, the second photosensitive film 117 is exposed to light by using a diffraction mask 115 consisting of a light shielding portion 115a, a semi-transmittance portion 115b and a transmittance portion 115c. The light shielding portion 115a of the diffraction mask 115 is disposed above the second photosensitive film 117 in correspondence to a source/drain electrode region and a region where the data line metal layer pattern (not shown, refer to 119c of FIG. 6) of the protrusion is formed. The semi-transmittance portion 115b of the diffraction mask 115 is positioned above the second photosensitive film 117 in correspondence to a region where a channel of a TFT is formed (channel region). Here, a mask using a diffraction effect of light, e.g., a half-ton mask or other mask may be used instead of the diffraction mask 115.

Figure 7D:
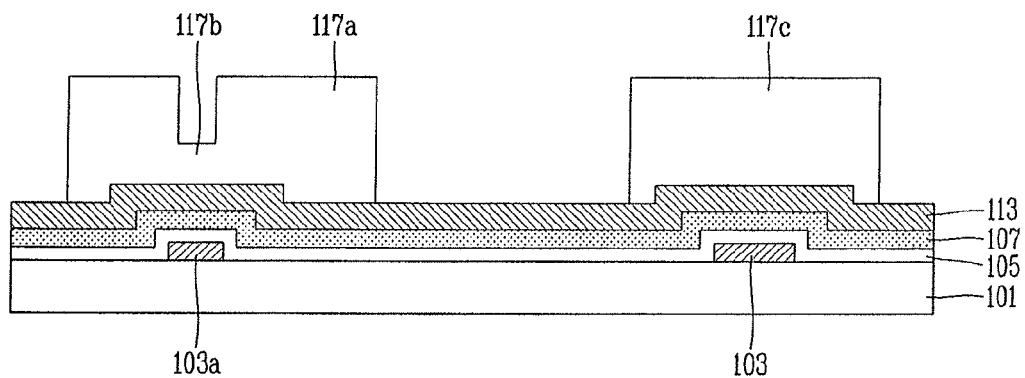

As shown in FIG. 7D, the second photosensitive film 117 having undergone the exposure process is selectively patterned through a development process, thereby forming second photosensitive film patterns 117a, 117b and 117c above protrusion forming regions, i.e., a source/drain electrode region, a channel region and a data line metal layer pattern region. Here, the second photosensitive film patterns 117a and 117c above the source/drain electrode region and the data line metal layer pattern region maintain the thickness of the second photosensitive film 117 since light has not passed therethrough. On the other hand, the second photosensitive film pattern 117b above the channel region has a thickness removed by a predetermined degree since light has partially passed therethrough. More concretely, the second photosensitive film pattern 117b above the channel region has a thickness thinner than that of the second photosensitive film patterns 117a and 117c above the source/drain electrode region and the data line metal layer pattern region.

Figure 7E:
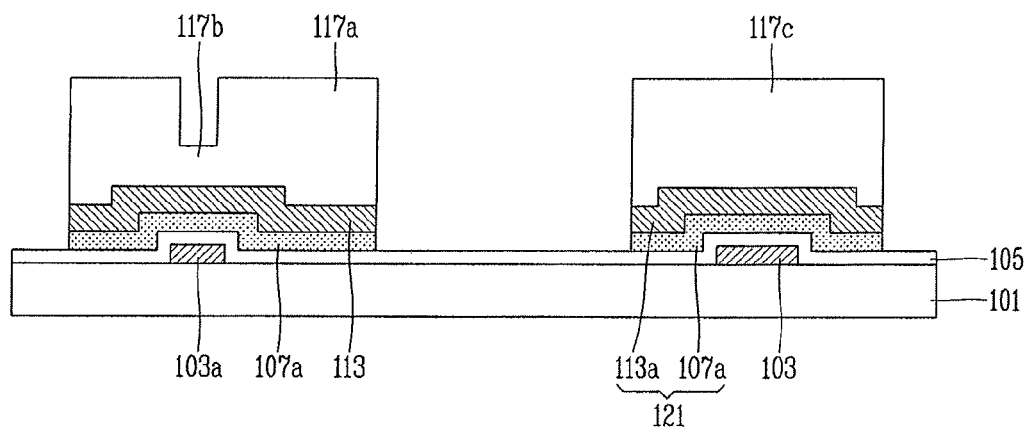

As shown in FIG. 7E, the second conductive metal layer 113 and the amorphous silicon layer 107 are sequentially patterned by using the second photosensitive film patterns 117a, 117b and 117c as a mask. As a result, a semiconductor layer 107a and a second conductive metal layer pattern 113 are formed on the gate insulating layer 105 corresponding to the gate electrode 103a, and a semiconductor layer 107a and a data line metal layer pattern 113a are formed on the gate insulating layer 105 corresponding to the gate line 103. Here, the semiconductor layer 107a and the data line metal layer pattern 113a constitute the protrusion 121. This protrusion 121 is formed above the gate line 103 in a crossing manner. Here, a long side of the protrusion 121 is formed to be wider than a width of the gate line 103. More concretely, as shown in FIG. 4, a vertical region (B) of the protrusion 121 is wider than a horizontal region (A).

Figure 7F:
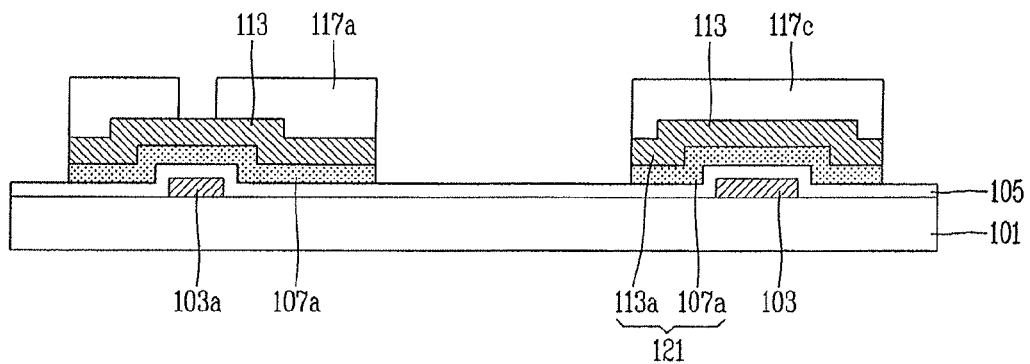

As shown in FIG. 7F, through an ashing process, the second photosensitive film pattern 117b formed above the channel region is completely removed, and the second photosensitive film patterns 117a and 117c formed above the source/drain electrode region and the metallic layer pattern 113a are partially removed. Here, the second conductive metal layer pattern 113 overlapped with an upper part of the channel region has an upper part exposed to the outside.

Figure 7G:
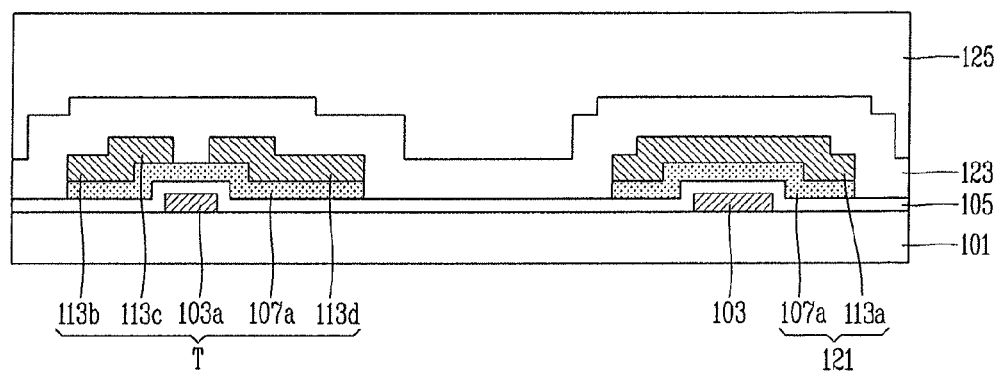

As shown in FIG. 7G, the second conductive metal layer pattern 113 is selectively patterned by using the second photosensitive film pattern 117a having a partially removed thickness as a mask. As a result, formed are a data line 113b crossing the gate line 103, a source electrode 113c extending from the data line 113b, and a drain electrode 113d spacing from the source electrode 113c.

Then, the second photosensitive film patterns 117a and 117c are removed, and a passivation layer 123 is deposited on the entire surface of the substrate including the data line 113b, the source electrode 113c extending from the data line 113b, and the drain electrode 113d spacing from the source electrode 113c. Then, a third photosensitive film 125 is deposited on the passivation layer 123.

Figure 7H:
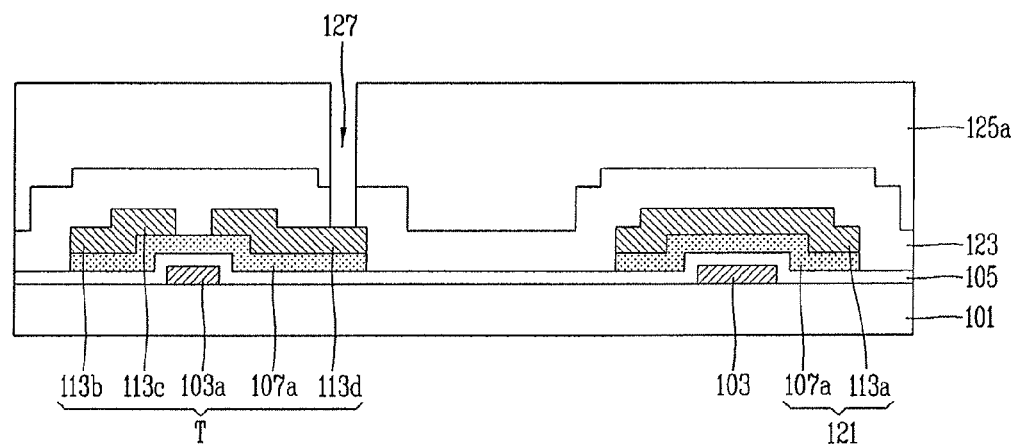

As shown in FIG. 7H, the third photosensitive film 125 is exposed to light and developed through a photolithography process using a mask, thereby forming a third photosensitive film pattern 125a.

Then, the passivation layer 123 is selectively patterned by using the third photosensitive film pattern 125a as a mask, thereby forming a contact hole 127 through which the drain electrode 113d is exposed to outside.

Figure 7I:
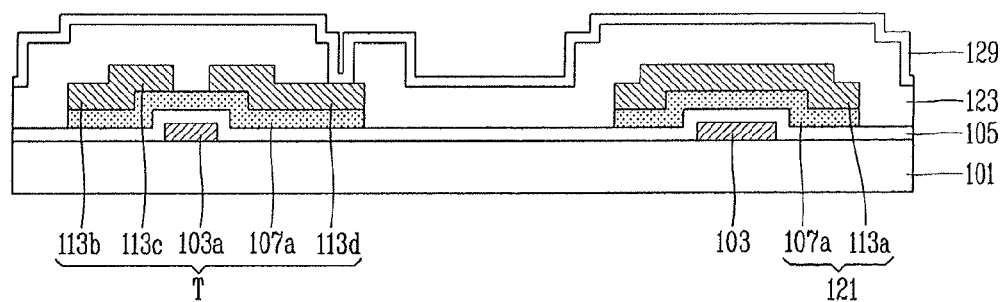

As shown in FIG. 7I, the third photosensitive film pattern 125a is removed, and then a transparent conductive layer 129 is deposited on the passivation layer 123 including the contact hole 127 by a sputtering method.

Although not shown, a fourth photosensitive film (not shown) is deposited on the transparent conductive layer 129. Then, the fourth photosensitive film is exposed to light and developed through a photolithography process using a mask, thereby forming a fourth photosensitive film pattern (not shown).

Figure 7J:
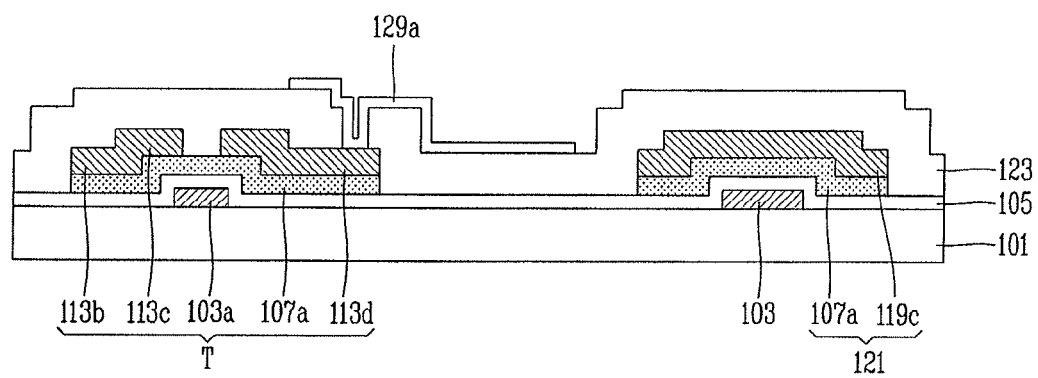

As shown in FIG. 7J, the transparent conductive layer 129 is selectively patterned by using the fourth photosensitive film (not shown) as a mask, thereby forming a pixel electrode 129a electrically connected to the drain electrode 113d. As a result, a process of fabricating the lower substrate array is completed. Here, common electrodes (not shown) may be formed in an alternating manner with the pixel electrodes 129a.

Figure 7K:
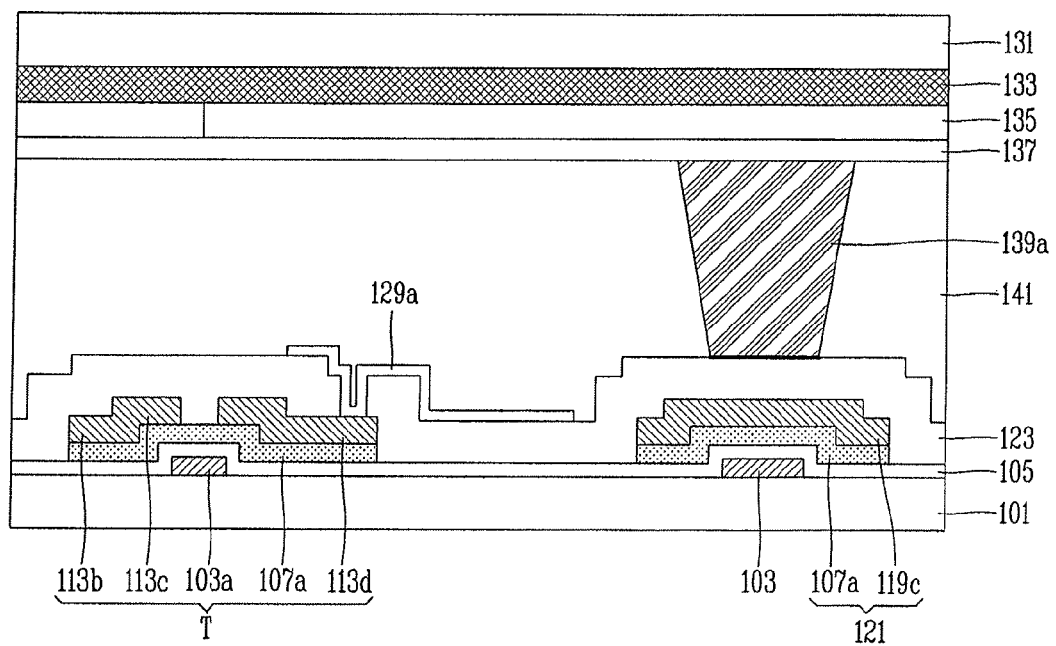

As shown in FIG. 7K, on the upper substrate 131 bonded to the lower substrate 101, formed is a black matrix layer 133 for shielding light incident onto a region rather than the pixel region.

Then, a color filter 135 of R, G and B is formed on the upper substrate 131 including the black matrix layer 133 according to each region. Here, the color filter 135 may be formed or may not be formed on the upper substrate corresponding to the gate lines and the data lines.

Then, a common electrode 137 is formed on the entire surface of the upper substrate 131 including the black matrix layer 133 and the color filter 135.

Then, a photosensitive resin layer (not shown) is deposited on the common electrode 137 with a thick thickness.

Then, the photosensitive resin layer is exposed to light by using a mask, thereby forming a first column spacer 139a and second column spacer 139b each having a protrusion on an upper surface of the upper substrate with a predetermined height. As a result, a process of fabricating the upper substrate array is completed. Here, the first column spacer 139a serves to maintain a cell gap, and the second column spacer 139b serves to prevent a pushed state of the protrusion by being spaced from the lower substrate 101 by a predetermined distance. The first and second column spacers 139a and 139b have the same height. The first column spacer 139a is arranged at a position corresponding to the protrusion 121, and the second column spacer 139b is arranged above the gate line 103 or the data line 119 at a position not corresponding to the protrusion 121.

Then, a liquid crystal is dispensed on the lower substrate 101, thereby forming a liquid crystal layer 141.

Then, the lower substrate 101 and the upper substrate 131 are bonded to each other. Here, the first column spacer 139a comes in contact with the protrusion 121 by a pressure generated during the bonding process. And, the second column spacer 139b is spacing from the protection film 123, the uppermost layer of the lower substrate 101.

In the present invention, the protrusion is formed to cross the gate lines. This may allow two sides of the protrusion not to have PPM changes due to process changes. The reason is because the protrusion 121 is defined by the gate line 103 having excellent uniformity in a glass substrate (mother substrate).

In case of the conventional circular protrusion, a single structure is implemented as an active tail is disposed below a source/drain electrode forming metal layer. This may cause changes of PPM (a ratio of a contact area with respect to a total area). However, in the present invention, the protrusion is formed to cross the gate lines to reduce the conventional problem by 50% or more. More concretely, as the data line metal layer pattern of the protrusion is disposed on the gate line in a crossing manner, the first region (A) has the same PPM as the conventional one. However, the second region (B) has PPM lower than the conventional one by 50% or more since it can be precisely defined by the gate lines.

In the LCD device according to the present invention, the protrusion is formed to cross the gate lines. This may minimize changes of PPM due to process changes, thereby reducing the occurrence of a gap defect.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

The invention claimed is:

1. A liquid crystal display (LCD) device, comprising:
a lower substrate;
gate lines and data lines crossing each other on the lower substrate, and defining pixel regions;
thin film transistors (TFTs) at intersections between the gate lines and the data lines;
protrusions disposed on the gate lines in a crossing manner;
an upper substrate disposed to face the lower substrate;
a first column spacer on the upper substrate, and corresponding to the protrusion disposed on the lower substrate;
a second column spacer disposed on the upper substrate with a distance from the lower substrate, and corresponding to a non-pixel region of the lower substrate; and
a liquid crystal layer filled in a space between the lower substrate and the upper substrate.

2. The LCD device of claim 1, wherein the TFT includes a gate electrode extending from the gate line, a source electrode overlapped with the gate electrode and extending from the data line, a drain electrode spacing from the source electrode, and a semiconductor layer disposed below the source electrode and the drain electrode.

3. The LCD device of claim 2, further comprising a pixel electrode electrically connected to the drain electrode of the TFT on the lower substrate.

4. The LCD device of claim 1, wherein the protrusion is implemented as a single layer of a data line metal layer pattern, the same layer as the data line, or a double layer of a data line metal layer pattern, the same layer as the data line and a semiconductor layer disposed below the data line metal layer pattern.

5. The LCD device of claim 1, wherein a long side of the protrusion crossing the gate line is formed to be wider than a width of the gate line.

6. The LCD device of claim 1, further comprising:
a black matrix layer on the upper substrate in correspondence to the gate line, the data line and the TFT;
a color filter layer in correspondence to the pixel region; and
a common electrode on an entire surface of the upper substrate including the black matrix layer and the color filter layer.

7. The LCD device of claim 3, further comprising a common electrode formed on the lower substrate in an alternating manner with the pixel electrode.

8. A method for fabricating a liquid crystal display (LCD) device, the method comprising:
providing a lower substrate and an upper substrate facing each other;
forming, on the lower substrate, a gate line and a gate electrode extending from the gate line;
forming a gate insulating layer on an entire surface of the substrate including the gate electrode and the gate line;
forming, on the gate insulating layer, a semiconductor layer covering the gate electrode;
forming, on the gate insulating layer including the semiconductor layer, a data line, a source electrode extending from the data line, a drain electrode spacing from the source electrode, and a protrusion crossing the gate line;
forming a passivation layer on an entire surface of the substrate including the data line, the source electrode and the drain electrode;
forming, in the passivation layer, a contact hole through which the drain electrode is exposed to outside;
forming, on the passivation layer, a pixel electrode electrically connected to the drain electrode through the contact hole;
forming a first column spacer at a position of the upper substrate corresponding to the protrusion;
forming a second column spacer, with a predetermined height, at a position of the upper substrate corresponding to the lower substrate and a non-pixel region;
dispensing a liquid crystal on the lower substrate; and
bonding the lower substrate and the upper substrate to each other.

9. The method of claim 8, wherein the protrusion is implemented as a single layer of a data line metal layer pattern, the same layer as the data line, or a double layer of a data line metal layer pattern, the same layer as the data line and a semiconductor layer disposed below the data line metal layer pattern.

10. The method of claim 8, wherein a long side of the protrusion crossing the gate line is formed to be wider than a width of the gate line.

11. The method of claim 8, further comprising:
forming a black matrix layer on the upper substrate in correspondence to the gate line, the data line and the TFT;
forming a color filter layer in correspondence to the pixel region; and
forming a common electrode on an entire surface of the upper substrate including the black matrix layer and the color filter layer.

12. The method of claim 8, further comprising forming a common electrode on the lower substrate in an alternating manner with the pixel electrode.

13. The method of claim 8, wherein the first and second column spacers have the same height.

* * * * *